United States Patent
Sugimori

(10) Patent No.: US 6,440,501 B2
(45) Date of Patent: Aug. 27, 2002

(54) APPARATUS AND METHOD FOR CURING SILICONE RUBBER

(75) Inventor: Masanobu Sugimori, Toyama-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/749,966

(22) Filed: Dec. 28, 2000

(30) Foreign Application Priority Data

Feb. 21, 2000 (JP) ........................................ 2000-042293

(51) Int. Cl.⁷ .............................. C08J 7/18; B29L 35/08
(52) U.S. Cl. .................. 427/515; 427/58; 427/100; 427/512; 427/559; 427/387; 425/174; 425/174.4; 425/501; 425/502
(58) Field of Search .............................. 425/174, 174.4, 425/501, 502; 427/58, 100, 508, 512, 515, 559, 387

(56) References Cited

U.S. PATENT DOCUMENTS

| | | | | |
|---|---|---|---|---|
| 4,920,296 A | * | 4/1990 | Takahashi et al. | 310/348 |
| 5,240,746 A | * | 8/1993 | O'Connell Litteral | 427/510 |
| 6,172,446 B1 | * | 1/2001 | Kanayama et al. | 310/348 |
| 6,323,471 B1 | * | 11/2001 | Yagi | 219/680 |

FOREIGN PATENT DOCUMENTS

| | | |
|---|---|---|
| JP | 1-228310 A | 9/1989 |
| JP | 1-228311 A | 9/1989 |
| JP | 2581342 B2 | 11/1996 |
| JP | 10-154717 A | 6/1998 |

OTHER PUBLICATIONS

English Abstract of JP 02309807 A Dec. 1990, Takahashi.*
English Abstract of JP 04208414 A Jul. 1992, Ito et al.*
English Abstract of JP 09247552 A Mar. 1996, Yagi.*

* cited by examiner

Primary Examiner—Robert Dawson
Assistant Examiner—Jeffrey B. Robertson
(74) Attorney, Agent, or Firm—Keating & Bennett, LLP

(57) ABSTRACT

An apparatus for curing silicone rubber is constructed so as to perform a heating process and a curing process in a very short time without degradation of characteristics in piezoelectric elements so as to improve productivity. A piezoelectric component having uncured silicone rubber coated on the external peripheral surface thereof is held in a jig having a property of reflecting far infrared rays. The uncured silicone rubber coated on the external peripheral surface of the piezoelectric component is irradiated with far infrared rays by a far infrared panel heater so as to cure the silicone rubber.

20 Claims, 7 Drawing Sheets

AL POWDER

INFRARED ABSORBANCE (ABS)

(μm)

INFRARED WAVELENGTH

APPARATUS AND METHOD FOR CURING SILICONE RUBBER

BACKGROUND OF THE INVENTION

1. Field of the Invention

The present invention relates to an apparatus for curing silicone rubber used with piezoelectric components or other electronic components, wherein after the periphery of piezoelectric element is covered with silicone rubber, the surrounding areas thereof are covered with an armoring resin.

2. Description of the Related Art

A conventional piezoelectric component is disclosed in Japanese Unexamined Patent Application Publication No. 1-228310, for example, wherein the periphery of a piezoelectric element having lead terminals attached thereto is covered with an elastic material such as silicone rubber and surroundings thereof are sealed with an armoring resin. The silicone rubber prevents changes in vibration characteristics of the piezoelectric element due to the contractile stress of the armoring resin and a damping effect on the restraining waveform distortion of the piezoelectric element as well.

In order to manufacture such a piezoelectric component, piezoelectric elements are attached to a lead frame, the periphery of the piezoelectric element is coated with silicone rubber by dipping it such that the lead frame is held by a jig so as to be heated and cured in an oven, then an epoxy resin is coated therearound by dipping it such that the lead frame is held by the jig so as to be heated and cured again in an oven and so as to define an armoring resin layer. Then the lead frame is removed from the jig and the piezoelectric component is obtained by separating lead terminals from the lead frame. In such a manner, mass-productivity is increased and uniform quality of the products is obtained as well by subjecting a plurality of piezoelectric elements, which are continued to be held by the jig, to the series of processes.

When the thermosetting silicone rubber is heated and cured in an oven, it is generally heated at a temperature in a range of 150° C. to 160° C. range, for 30 minutes to 1 hour by utilizing direct heat transmission of hot air. However, when a piezoelectric element (a piezoelectric ceramic element, for example) is exposed to such a high temperature for a long time, there is a problem that piezoelectric characteristics are degraded (dipole).

In such methods that the silicone rubber coating and the armoring resin forming processes are performed while a plurality of piezoelectric elements are held on a jig as described above, during the heating and curing in an oven, the jig as well as piezoelectric elements must be heated because the jig holding the piezoelectric elements is inserted into the oven. Since the thermal capacity of the jig is much greater than the thermal capacity of the piezoelectric elements, the jig requires a heating time and it also requires a cooling time after being removed from the oven, so that there is a problem that a long time is required for the curing process of the silicone rubber.

Furthermore, in the conventional heating and curing apparatus having a heater and a fan, the equipment must be relatively scale, resulting in a problem of high cost when including a conveying system.

SUMMARY OF THE INVENTION

In order to overcome the problems described above, preferred embodiments of the present invention provide a curing method and a curing apparatus wherein heating and curing processes are performed very quickly and without degrading the characteristics of the piezoelectric element so as to improve productivity of electronic component manufacturing.

In accordance with a first preferred embodiment of the present invention, a method of curing silicone rubber includes the steps of holding a plurality of piezoelectric elements in a jig, coating silicone rubber on external surfaces of the piezoelectric elements held by the jig, and irradiating the uncured silicone rubber coated on the external surfaces of the piezoelectric elements with far infrared rays so as to cure the silicone rubber.

In accordance with a second preferred embodiment of the present invention, there is provided a curing apparatus for silicone rubber for curing the silicone rubber coated on external surfaces of electronic components such as piezoelectric elements, the curing apparatus including a jig for holding the piezoelectric elements having the uncured silicone rubber coated on the external surfaces thereof, and having the property of reflecting far infrared rays, and a far-infrared-ray generating unit for irradiating the uncured silicone rubber coated on the external surfaces of the piezoelectric elements with far infrared rays so as to cure the silicone rubber.

According to preferred embodiments of the present invention, after the external peripheral surface of piezoelectric element is coated with the uncured silicone rubber in the state that plurality of electronic components are supported in a jig, the jig is transported to a far infrared generating unit. When the piezoelectric elements are irradiated with far infrared rays generated in the far infrared generating unit, the far infrared rays are selectively absorbed into the silicone rubber coated on the electronic components while they are not substantially absorbed in the jig and the electronic components. Therefore, the electronic components, e.g., piezoelectric elements do not produce heat, and degradation (dipole) of piezoelectric characteristics is thereby prevented. Also, the jig having a large thermal capacity does not produce heat, so that the time for heating and the period for cooling after the curing process is greatly reduced. Since in the silicone rubber, heat is produced from the inside thereof by far infrared rays, the curing proceeds evenly, so that the entire silicone rubber can be uniformly cured.

Preferably, the far infrared rays emitted from the far infrared generating unit include wavelengths of about 7 to about 15 $\mu$m. The range of the wavelengths is generally 5 $\mu$m to 1000 $\mu$m, and among the wavelengths, the absorption spectrum of the silicone rubber exhibits the highest level in the wavelengths of about 7 $\mu$m to about 15 $\mu$m. By irradiating the silicone rubber with the far infrared rays including this wavelength range, the far infrared rays can be effectively absorbed into the silicone rubber while not being absorbed in the electronic components and jig, and the thermal efficiency is thereby improved.

Other features, characteristics, elements and advantages of the present invention will become apparent from the following detailed description of preferred embodiments with reference to the attached drawings.

DETAILED DESCRIPTION OF PREFERRED EMBODIMENTS

Figure 1:
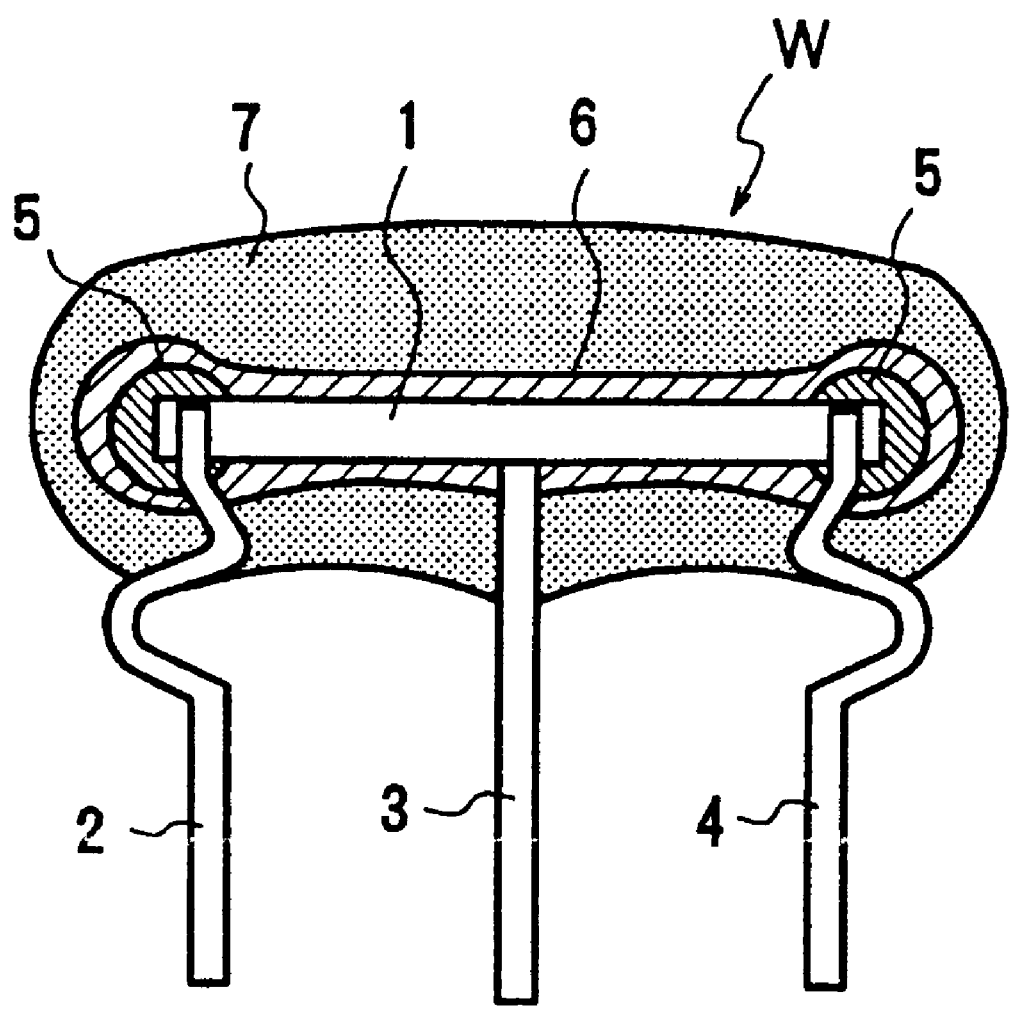
FIG. 1 is a longitudinal sectional view of an example of a piezoelectric element according to a preferred embodiment of the present invention.

FIG. 1 shows an example of a work W used in a curing apparatus for silicone rubber according to a preferred embodiment of the present invention.

The work W according to a preferred embodiment of the present invention is a piezoelectric component having lead terminals. The work W preferably includes a substantially rectangular piezoelectric element 1 including a shear mode vibration element, for example, and three lead terminals 2 to 4. Both end portions including at least both end edges of the piezoelectric element 1 having the lead terminals 2 to 4 adhered thereto are covered with a first silicone rubber 5. The entire surroundings of the piezoelectric element 1 covered with the first silicone rubber 5 are covered with a second silicone rubber 6, and the entire surroundings thereof are further covered with an armoring resin 7 such as an epoxy resin.

In the piezoelectric component W formed as described above, since both end-edge portions which are most susceptible to a contractile stress of the armoring resin 7 are covered with double silicone rubber films 5 and 6, even when the contractile stress of the armoring resin 7 is changed due to changes in temperature and changes in the stress can be absorbed, resulting in solving the problem of changes in characteristics due to temperature. Also, the damping effect of the piezoelectric component W is secured by the second silicone rubber 6, so that the piezoelectric component W has a feature that waveform distortion is prevented from occurring.

Figure 2:
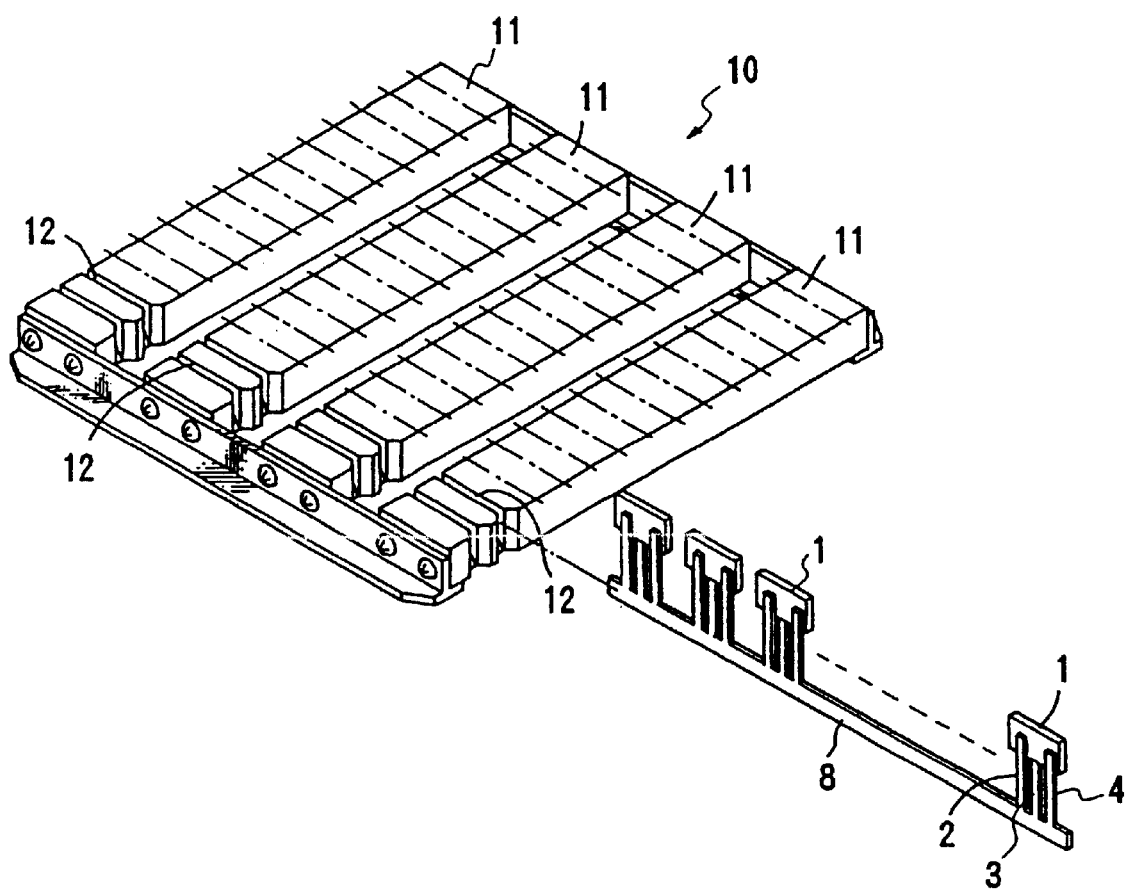
FIG. 2 is a perspective view of a jig used for manufacturing the piezoelectric element shown in FIG. 1.

As shown in FIG. 2, the piezoelectric components W are aligned and held in a jig 10 such that a plurality of piezoelectric elements 1 are attached to a lead frame 8. The jig 10 used in a preferred embodiment is preferably the jig disclosed in Japanese Patent No. 2581342, for example, wherein on the top surfaces of non-magnetic hard substrates 11, a plurality of holding grooves 12 for holding strip portions of the lead frames 8 are formed, and wherein a plurality of magnetic lead frames 8 are arranged and absorbed in a line to be held by a magnet (not shown). The hard substrates 11 of the jig 10 are made of a lustrous metallic plate, such as an aluminum plate, having a property of reflecting far infrared rays.

The piezoelectric components W held by the jig 10 as described above are subjected to a coating process of the first silicone rubber 5 after being coated with the first silicone rubber 5 by dripping. Then the work W is sent to an apparatus for curing silicone rubber, which will be described later, so that the uncured first silicone rubber 5 is heated and cured. Then the work W is subjected to a coating process of the second silicone rubber 6, after being coated with the second silicone rubber 6 by dipping, or other suitable process, it is again sent to the curing apparatus for silicone rubber, which will be described later, so that the uncured second silicone rubber 6 is heated and cured.

Figure 3:
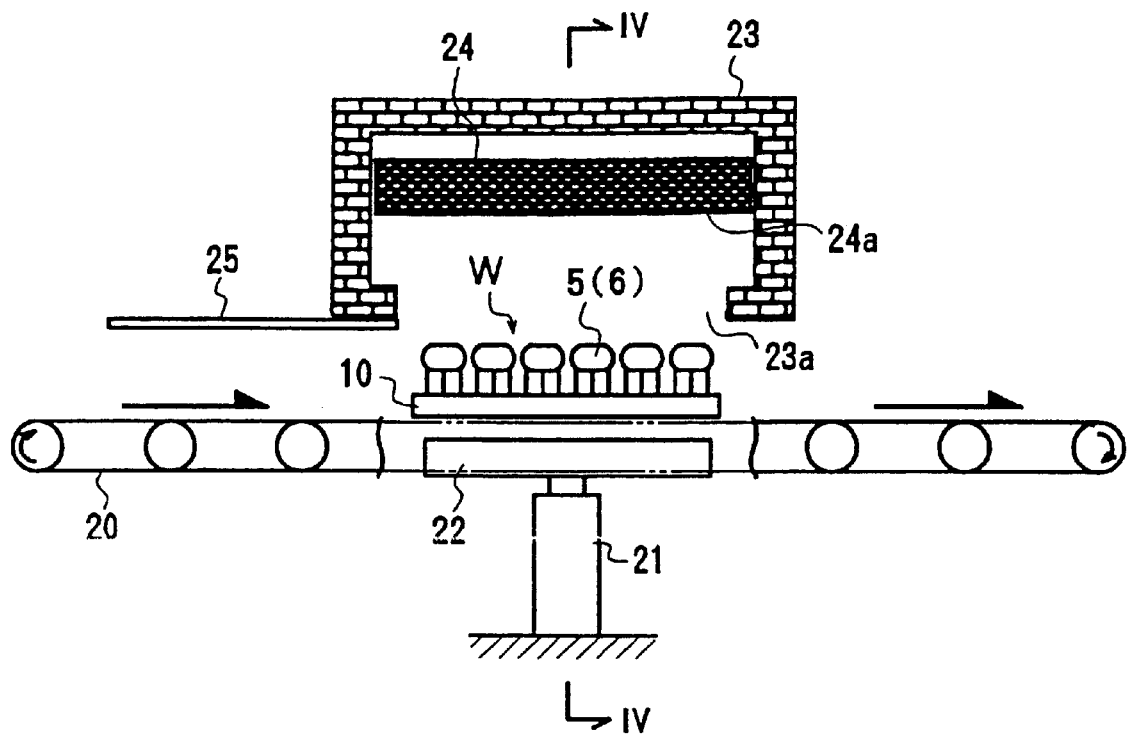
FIG. 3 is a side view of an example of an apparatus for curing silicone rubber according to a preferred embodiment of the present invention.
Figure 4:
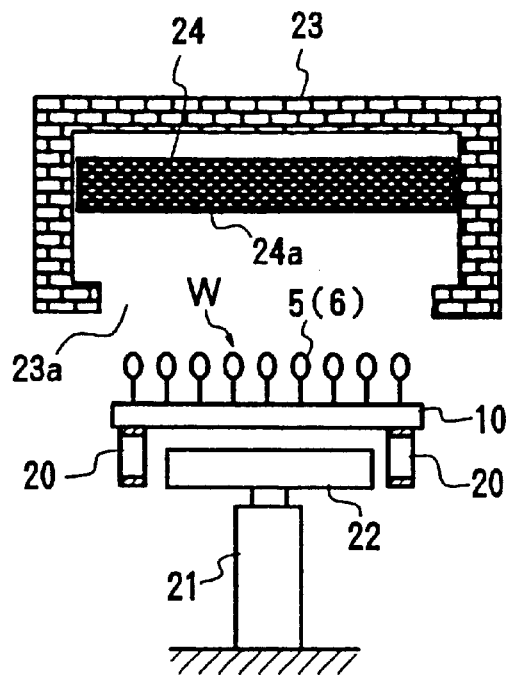
FIG. 4 is a cross-sectional view along line IV-IV of FIG. 3.
Figure 5:
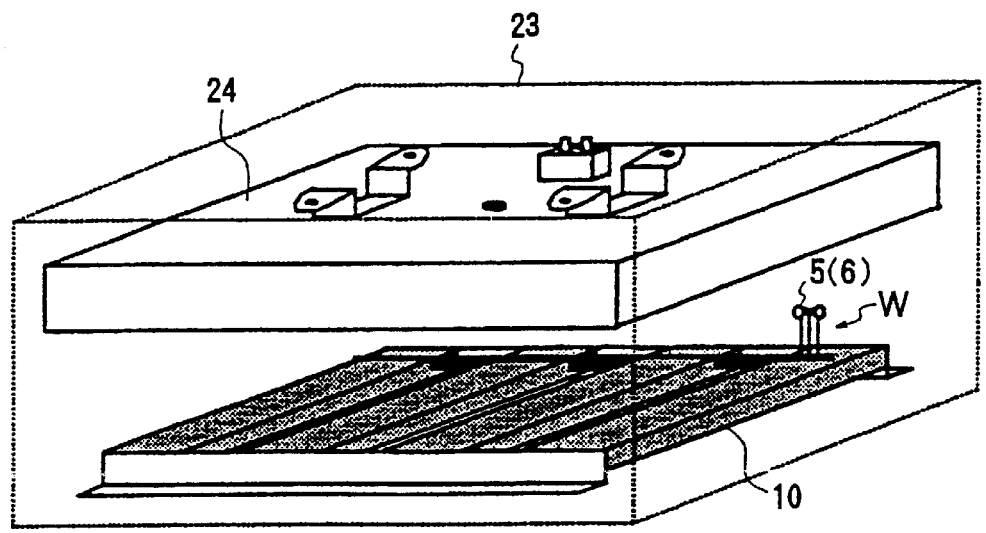
FIG. 5 is a perspective view of a curing furnace.
Figure 6:
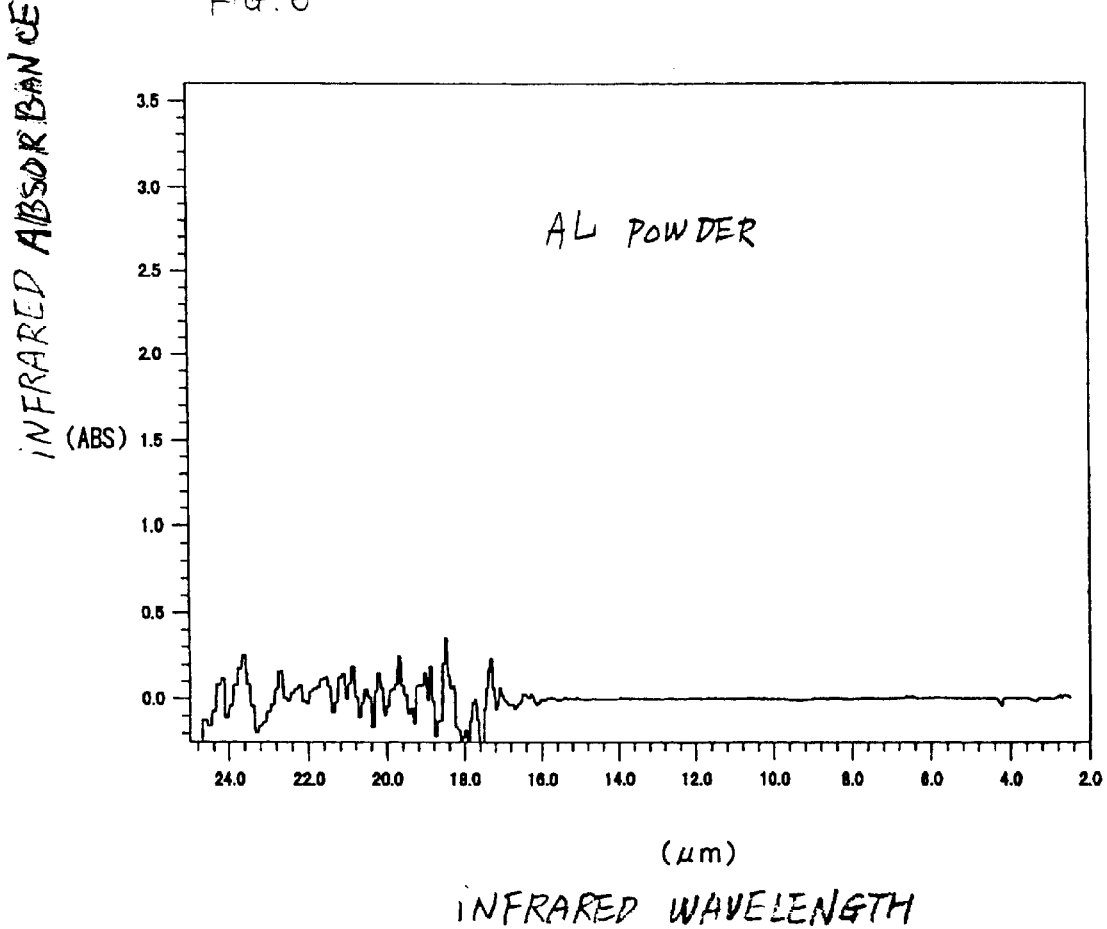
FIG. 6 is a graph showing characteristics of infrared absorption of aluminum powder forming a jig.
Figure 7:
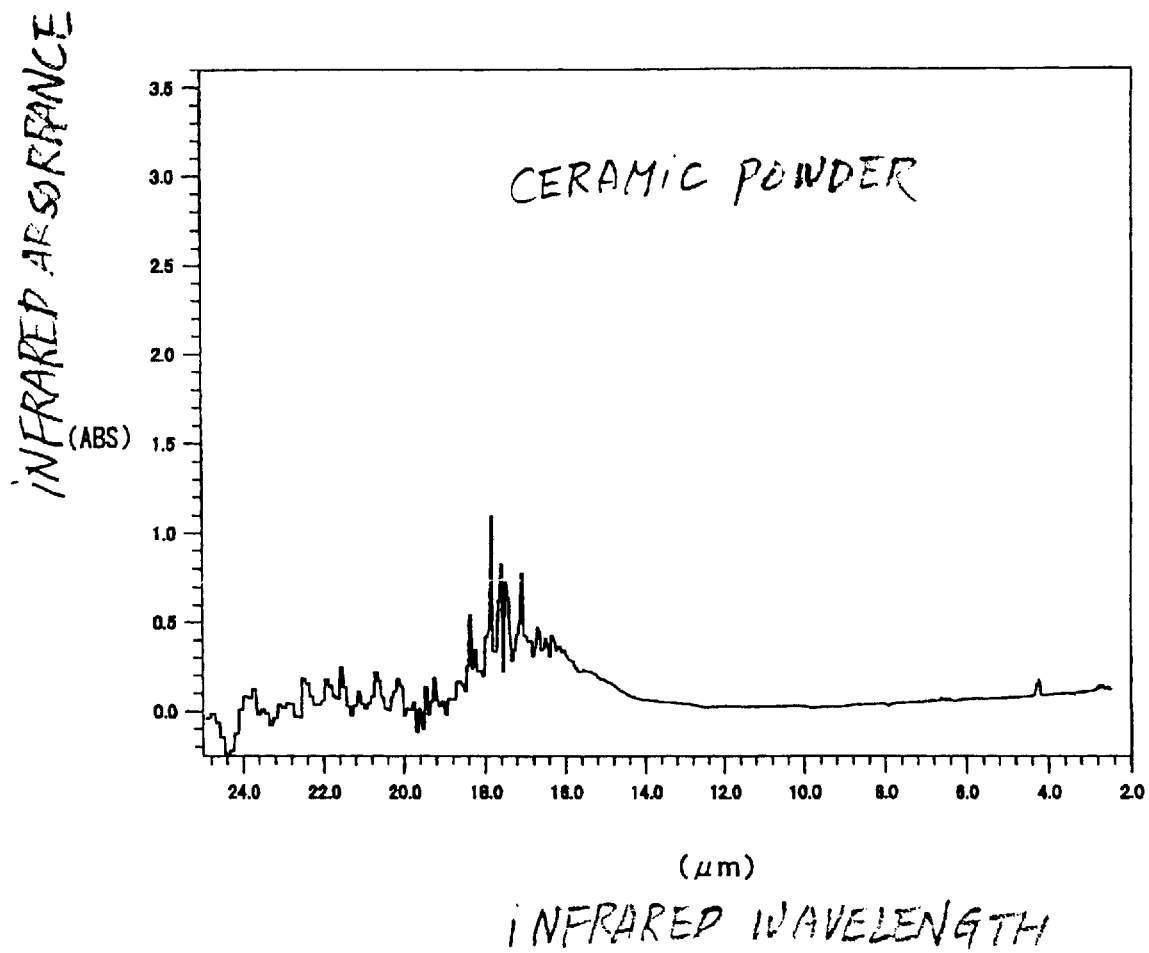
FIG. 7 is a graph showing characteristics of infrared absorption of ceramic powder forming an electronic component such as a piezoelectric element.
Figure 8:
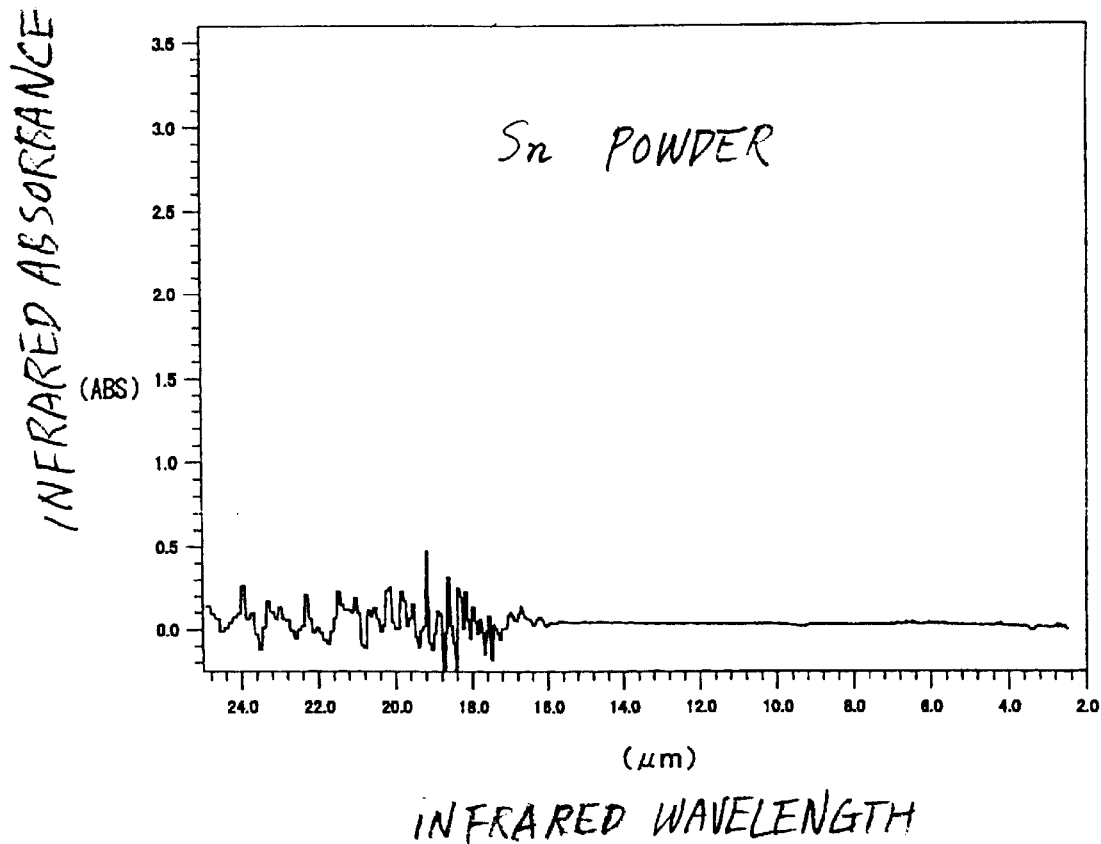
FIG. 8 is a graph showing characteristics of infrared absorption of Sn powder forming a terminal.
Figure 9:
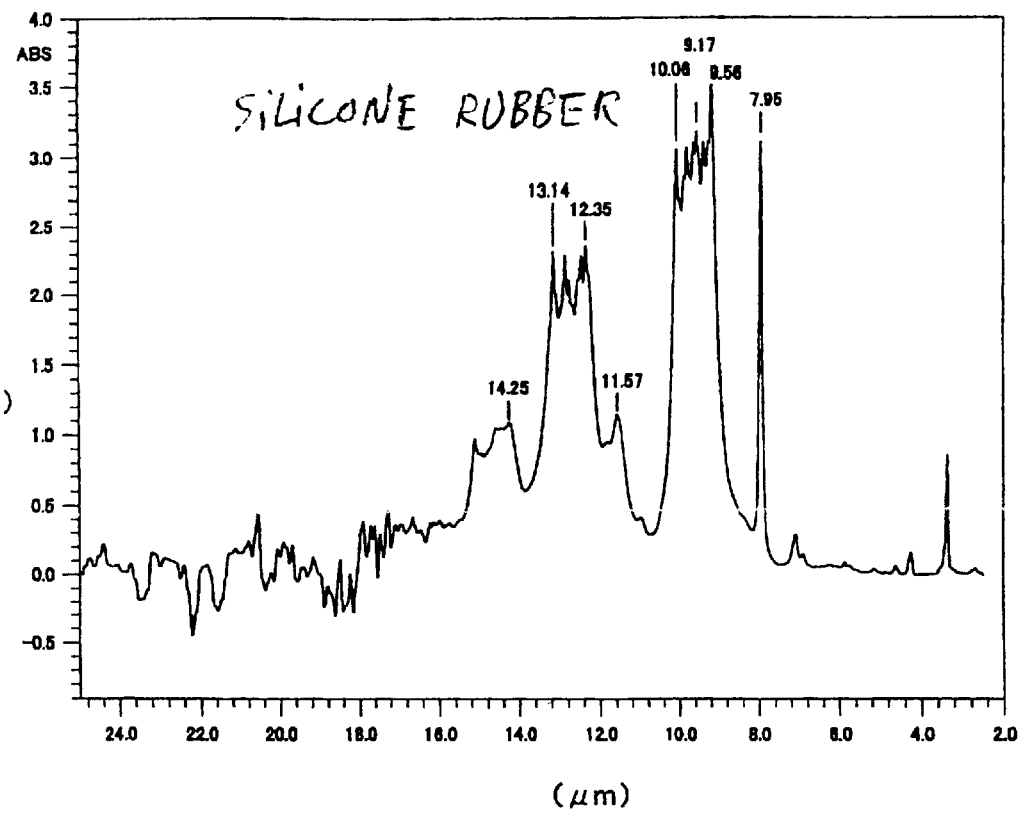
FIG. 9 is a graph showing characteristics of infrared absorption of silicone rubber.

FIGS. 3 to 5 show an example of an apparatus for curing silicone rubber according to a preferred embodiment of the present invention.

A conveyor 20 conveys the jig 10 carrying the works W therewith in the direction indicated by arrows. At the intermediate position of the conveyor 20, a pusher 22 is provided for being driven up-and-down by an elevating unit 21 such as a cylinder. As shown in FIG. 4, the pusher 22 rises and falls between a pair of conveyors 20 so as to raise the jig 10 vertically.

Over the elevating unit 21, a curing furnace 23 is provided. The furnace wall of the curing furnace 23 is preferably made of a heat insulating material so as to prevent variations in the temperature of a heater 24, which will be described later. On the bottom surface of the curing furnace 23, a jig-insertable opening 23a is formed. Inside the curing furnace 23, the far-infrared panel heater 24 having a heat-generating surface 24a facing downwardly is horizontally fixed thereto. The heat-generating surface 24a of the far-infrared panel heater 24 has a larger area than that of the jig 10. The wavelength of emitting far infrared rays is set in accordance with the absorption spectrum of the silicone rubber.

Inside the curing furnace 23, a support member not shown) for supporting the bottom surfaces of side ends of the jig 10 is arranged. The support member is arranged to support the jig 10 horizontally relative to the heat-generating surface 24a of the far-infrared panel heater 24 by supporting the bottom surface of the jig 10 when the jig 10 is inserted inside the curing furnace 23 by the pusher 22. In the bottom of the curing furnace 23, a shutter 25 being opened and closed by a driver (not shown) is arranged. The shutter 25 is for closing the opening 23a of the curing furnace 23 so as to prevent ambient air from entering therein.

Next, the operation of the apparatus for curing silicone rubber will be described.

The jig 10 placed on the conveyors 20 is conveyed in the direction of arrows so as to be stopped underneath the curing furnace 23. Then the jig 10 is raised from the conveyors 20 by the pusher 22, while the driver is driven and the shutter 25 is opened, so as to be inserted inside the curing furnace 23 from the opening 23a thereof.

After the jig 10 is inserted into the curing furnace 23, the bottom surface of the jig 10 is supported by the support member, so that the jig 10 is horizontally supported relative to the heat-generating surface 24a of the far-infrared panel heater 24. Then the shutter 25 closes the opening 23a of the curing furnace 23.

Next, the works W arranged on the jig 10 are irradiated with far infrared rays by the far-infrared panel heater 24 so as to cure the silicone rubber films 5 and 6 coated on the works W. When the emitting far infrared rays include wavelengths of about 7 $\mu$m to about 15 $\mu$m, in particular, the silicone rubber films 5 and 6 can be efficiently heated substantially without heating the jig 10 and the piezoelectric components W.

After the silicone rubber films 5 and 6 are heated and cured, the shutter 25 is opened, the pusher 22 is elevated by the elevating unit 21 so as to support the bottom surface of the jig 10 in the curing furnace 23, the jig 10 is taken out from the curing furnace 23 by lowering the pusher 22, and the shutter 25 is closed. Then the jig 10 is placed on the conveyors 20 so as to be transferred in the direction of arrows by driving the conveyors 20.

FIGS. 6 to 9 show measured results of characteristics in the infrared absorption of aluminum powder forming the jig 10, ceramic powder forming the piezoelectric component W, Sn powder forming the terminals 2 to 4, and the silicone rubber, respectively. In the drawings, the abscissa shows the wavelength of infrared rays while the ordinate shows the absorbance of the infrared rays.

It is understood that the silicone rubber has an absorption spectrum in the far infrared range (wavelengths of about 5 μm to about 1000 μm). In particular, in the range of about 7 μm to about 15 μm, peaks of the absorption spectrum exist. In contrast, other materials have scarcely the absorption spectrum in the far infrared range, so that they are difficult to be heated. Therefore, it is understood that when irradiated with far infrared rays, only the silicone rubber is selectively heated.

The following operations and advantages can be obtained by using far infrared rays as described above.

(1) Curing the silicone rubber in a short time

Since the silicone rubber fully absorbs far infrared rays as described above, the temperature thereof can be efficiently increased within a short time. With an increasing raising rate of temperature, the curing time can be reduced. Since the temperature of only the silicone rubber is increased, the curing temperature of the silicone rubber can be very high, so that the curing time is greatly minimized.

For example, while in the conventional curing apparatus using an oven, 10 minutes are required to heat and cure the silicone rubber at 160° C., only approximately 90 seconds is required to cure the silicone rubber when using the far-infrared panel heater according to preferred embodiments of the present invention.

(2) Reduction in the heating and curing time

As described above, the jig 10 does not absorb far infrared rays well and the irradiating time of the far infrared rays is small, so that the jig 10 cannot be substantially heated. Therefore, the jig 10 can be continuously used as it is without cooling it, and the heating and curing times are greatly reduced.

(3) Reduction in equipment costs

The far-infrared heater is simpler and more compact in structure than the oven, so that the productivity per unit area is improved. The far-infrared panel heater, which is the essential element of the apparatus, is relatively inexpensive. Furthermore, the cooling device for the jig 10 can be omitted, resulting in reduction in equipment costs.

(4) Cautions

A precaution must be taken when using far infrared rays is to avoid variations in the temperature. In order to solve this problem, the size of the heater, the insulating structure, and the distance between the heater and the works W are important.

The size of the heater is such that it is preferable to use a heater having a size that is larger than the area for heating the works, because the temperature of end portions of the heater is liable to be lowered due to the escaping of the heat in the lateral directions.

The insulating structure should be arranged to deal with the problem that variations in the heater temperature lead to variations in the temperature of the works W. Therefore, in order to unify the temperatures over the surface, the curing furnace 23 is constructed of an insulated structure so as to prevent the heat from escaping to the ambience to the utmost.

The distance to the heater is also important. When the distance between the heater and the works W is too small, there are problems that variations in the heater temperature directly have an effect thereon, and the heat transmission through air exerts influence thereon. Conversely, when the works W are separated from the heater in the distance, although variations in the temperature are reduced, the thermal efficiency of the heater is reduced. Therefore, in view of these conditions, the distance must be properly determined.

The present invention is not limited to the above-described preferred embodiments.

In the above-described preferred embodiments, a piezoelectric component W having lead terminals and covered with double layers of silicone rubber is shown. However, the piezoelectric element may be covered with a single layer of silicone rubber. However, when it is covered with double layers of silicone rubber, preferred embodiments of the present invention are more efficient because two steps of heating and curing are needed.

Figure 10:
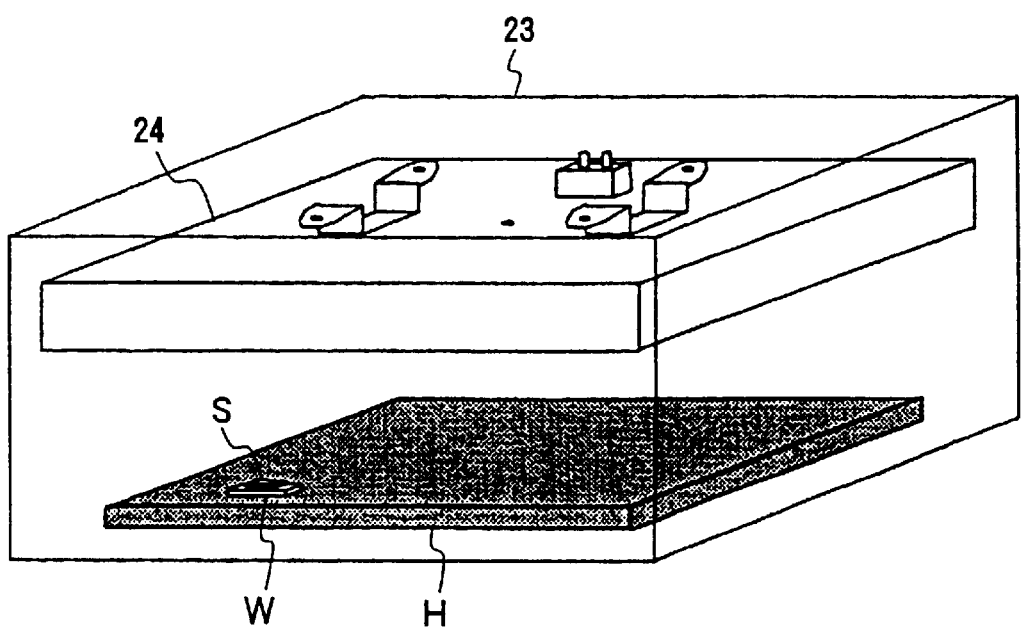
FIG. 10 is a perspective view of another example of a curing apparatus for silicone rubber according to a preferred embodiment of the present invention.

As shown in FIG. 10, preferred embodiments of the present invention can be applied to not only the piezoelectric component having lead terminals but also to a chip piezoelectric component W partially covered with silicone rubber S coated thereon. In the latter case, the piezoelectric component W may be conveyed by placing it on a planar jig H into the curing furnace 23 shown in FIG. 3.

Also, it should be noted that any other electronic component including silicone material can be used with the method and apparatus for curing silicone rubber of the present invention.

In this preferred embodiment, the jig 10 is used in both curing processes of the first silicone rubber 5 and the second silicone rubber 6. However, the jig may be also used in the curing process of the armoring resin 7. In particular, when an epoxy resin is used as the armoring resin 7, since the epoxy resin has an absorption spectrum in the far infrared range similarly as the silicone rubber, the same infrared heater can be used for both curing processes of the silicone rubber and the armoring resin.

In this preferred embodiment, the batch-type curing furnace 23 is shown, however, a continuous-type-curing furnace may be used. That is, a conveyor is continuously arranged from the inlet of the curing furnace toward the outlet thereof, so that the works W are heated by the far infrared heater while the jig is conveyed by the conveyor so as to cure the silicone rubber.

The curing apparatus according to preferred embodiments of the present invention can cure the silicone rubber within a very short time, so that it is effective that it be applied to the continuous-type-curing furnace, which cannot hold the silicone rubber for a long time in the furnace.

As understood from the above description, according to preferred embodiments of the present invention, the piezoelectric element covered with the uncured silicone rubber is supported on the jig and the silicone rubber is irradiated with far infrared rays, so that the far infrared rays are selectively absorbed into the silicone rubber, and the silicone rubber is thereby cured in a short time. The far infrared rays cannot be substantially absorbed in the piezoelectric element, so that it does not produce heat, and the degradation of piezoelectric characteristics is also reliably prevented.

Also, the jig scarcely absorbs far infrared rays, so that it is not substantially heated because of the short irradiation time. Therefore, the jig can be continuously used as it is without cooling it, and the productivity is thereby improved.

Furthermore, since in the silicone rubber, the heat is produced from the inside thereof by far infrared rays, the curing proceeds evenly, so that the entire silicone rubber is uniformly cured.

While preferred embodiments of the present invention have been described above, it is to be understood that modifications and changes will be apparent to those skilled in the art without departing from the spirit of the invention. The scope of the invention, therefore, is to be determined solely by the following claims.

What is claimed is:

1. A curing method for silicone rubber, comprising the steps of:
   holding a plurality of electronic components in a jig;
   coating silicone rubber on external surfaces of the electronic components held by the jig; and
   irradiating the uncured silicone rubber coated on the external surfaces of the electronic components with far infrared rays so as to cure the silicone rubber.

2. A method according to claim 1, wherein the far infrared rays include wavelengths of about 7 $\mu$m to about 15 $\mu$m.

3. A method according to claim 1, wherein the electronic components are piezoelectric components.

4. A method according to claim 1, wherein the electronic components include piezoelectric components having lead terminals.

5. A method according to claim 1, wherein electronic components include substantially rectangular piezoelectric elements including shear mode vibration elements and a plurality of lead terminals.

6. A method according to claim 5, wherein the lead terminals are covered by a first silicone rubber in the step of coating silicone rubber on external surfaces of the electronic components held by the jig.

7. A method according to claim 6, further comprising the step of coating a second silicone rubber covering the entire area of the piezoelectric elements.

8. A method according to claim 7, further comprising the step of coating an epoxy resin on the second silicone rubber so as to cover the entire area of the piezoelectric elements after the step of irradiating the uncured silicone rubber.

9. A method according to claim 7, wherein the first silicone rubber is cured during the step of irradiating the uncured silicone rubber coated on the external surfaces of the electronic components before the second silicone rubber is applied.

10. A method according to claim 1, wherein during the step of irradiating the uncured silicone rubber coated on the external surfaces of the electronic components with far infrared rays so as to cure the silicone rubber, the far infrared rays are not absorbed by the jig.

11. An apparatus for curing silicone rubber coated on external surfaces of electronic components, the curing apparatus comprising:
    a jig arranged to holding the electronic components having uncured silicone rubber coated on external surfaces thereof, the jig having the property of reflecting far infrared rays; and
    a far-infrared-ray generating unit for irradiating the uncured silicone rubber coated on the external surfaces of the electronic components with far infrared rays so as to cure the silicone rubber.

12. An apparatus according to claim 11, wherein the far infrared rays emitted by the far-infrared-ray generating unit include wavelengths of about 7 $\mu$m to about 15 $\mu$m.

13. An apparatus according to claim 11, wherein the electronic components are piezoelectric components.

14. An apparatus according to claim 11, further comprising a conveyor arranged to transport the jig from a silicone rubber application unit to the far-infrared-ray generating unit.

15. An apparatus according to claim 11, wherein the far infrared ray generating unit includes a curing furnace including a furnace wall made of a heat insulating material.

16. An apparatus according to claim 11, wherein the far-infrared-ray generating unit includes a far-infrared panel heater having a heat-generating surface which has an area that is larger an area of the jig.

17. An apparatus according to claim 11, wherein the jig is made of a material that does not absorb far infrared rays.

18. An apparatus according to claim 11, wherein the jig is made of a material that is not heated in response to application of far infrared rays.

19. An apparatus according to claim 11, wherein the electronic components include piezoelectric components having lead terminals.

20. An apparatus according to claim 11, wherein electronic components include substantially rectangular piezoelectric elements including shear mode vibration elements and a plurality of lead terminals.

* * * * *